United States Patent
Wang et al.

(10) Patent No.: US 8,860,046 B2
(45) Date of Patent: Oct. 14, 2014

(54) LIGHT-EMITTING DIODE DEVICE

(71) Applicant: Epistar corporation, Hsinchu (TW)

(72) Inventors: Jhih-Sian Wang, Hsinchu (TW); Chia-Liang Hsu, Hsinchu (TW); Yi-Ming Chen, Hsinchu (TW); Yi-Tang Lai, Hsinchu (TW)

(73) Assignee: Epistar Corporation (TW)

( * ) Notice: Subject to any disclaimer, the term of this patent is extended or adjusted under 35 U.S.C. 154(b) by 0 days.

(21) Appl. No.: 13/767,217

(22) Filed: Feb. 14, 2013

(65) Prior Publication Data

US 2013/0228802 A1 Sep. 5, 2013

(30) Foreign Application Priority Data

Feb. 17, 2012 (TW) .............................. 101105428 A

(51) Int. Cl.
| | |
|---|---|
| *H01L 29/18* | (2006.01) |
| *H01L 27/15* | (2006.01) |
| *F21K 99/00* | (2010.01) |
| *H01L 25/075* | (2006.01) |
| *F21Y 101/02* | (2006.01) |
| *H01L 33/38* | (2010.01) |
| *F21Y 105/00* | (2006.01) |

(52) U.S. Cl.
CPC ........... *H01L 27/156* (2013.01); *H01L 25/0753* (2013.01); *H01L 2224/48091* (2013.01); *F21K 9/00* (2013.01); *F21Y 2101/02* (2013.01); *H01L 33/38* (2013.01); *F21Y 2105/003* (2013.01); *H01L 2224/73265* (2013.01)

USPC ................... 257/88; 257/13; 257/87; 257/89; 257/91; 257/96

(58) Field of Classification Search
None
See application file for complete search history.

(56) References Cited

U.S. PATENT DOCUMENTS

| 7,732,825 | B2 | 6/2010 | Kim et al. | |
|---|---|---|---|---|
| 2009/0272991 | A1* | 11/2009 | Lee et al. | 257/91 |
| 2011/0211348 | A1* | 9/2011 | Kim | 362/235 |

* cited by examiner

*Primary Examiner* — Kyoung Lee
(74) *Attorney, Agent, or Firm* — Bacon & Thomas, PLLC

(57) ABSTRACT

A two dimensional array light-emitting diode device is disclosed, which includes a transparent substrate including a first surface; a plurality of adjacent light-emitting diode units arranged on the first surface, wherein each of the light-emitting diode units including a plurality of sides and a circumference; and a plurality of conductive connecting structures arranged on the first surface, electrically connecting the plurality of light-emitting diode units mentioned above; wherein the sides of each of the light-emitting diode units have a plurality of vertical distances between the closest light-emitting diode units, and when the plurality of vertical distances larger than 50 μm, the sides are not near the closest light-emitting diode units; wherein the ratio of the total length of the sides not near the light-emitting diode units of each light-emitting diode unit and the circumference of the light-emitting diode unit is larger than 50%.

10 Claims, 10 Drawing Sheets

LIGHT-EMITTING DIODE DEVICE

TECHNICAL FIELD

The disclosure relates to a two dimensional array light-emitting diode device, especially relates to a two dimensional array HV light-emitting diode device with a high light extraction efficiency.

REFERENCE TO RELATED APPLICATION

This application claims the right of priority based on TW application Serial No. 101105428, filed on Feb. 20, 2012, and the content of which is hereby incorporated by reference in its entirety.

DESCRIPTION OF BACKGROUND ART

The lighting theory and structure of light-emitting diode (LED) is different from that of conventional lighting source. An LED has advantages like low power loss, long life-time, no need for warming time, and fast responsive time. Moreover, it is small, shockproof, suitable for mass production, so LEDs are widely adopted in the market. For example, LEDs can be used in optical display apparatus, laser diodes, traffic lights, data storage devices, communication devices, illumination devices, medical devices, and so on.

The conventional two dimensional array light emitting diode device 1 shown as FIGS. 1A and 1B comprises a transparent substrate 10, a plurality of light-emitting diode units 12 extending along two dimensions and closely arranged and formed on the transparent substrate 10. Every light-emitting diode unit 12 comprises one p-type semiconductor layer 121, one light-emitting layer 122, and one n-type semiconductor layer 123. Because the transparent substrate is electrically insulating, after forming the grooves by etching between the light-emitting diode units 12, each light-emitting diode unit can be insulated to each other. Then, etching part of each light-emitting diode unit 12 to the n-type semiconductor layer 123 and forming a first electrode 18 and a second electrode 16 on the exposed region of the n-type semiconductor layer 123 and the p-type semiconductor 121, respectively. Furthermore, the first electrodes 18 and the second electrodes 16 of the plurality of the light-emitting diode units 12 are selectively connected by the conductive connecting structures 19 in order to make the plurality of the light-emitting diode units 12 to electrically connect in parallel or in series. Wherein, there can be air under the conductive connecting structure 19, or an insulating layer 13 can be formed on part surfaces of the epitaxial layers of the light-emitting diode units 12 and the regions between the adjacent light-emitting diode units 12 by chemical vapor deposition method (CVD), physical vapor deposition method (PVD), or sputtering method and so on in order to protect and electrically insulate the epitaxial layers of the adjacent light-emitting diode units 12. The material of the insulating layer 13 can be aluminum oxide ($Al_2O_3$), silicon dioxide ($SiO_2$), aluminum nitride (AlN), silicon nitride ($SiNO_x$), titanium oxide ($TiO_2$), and the combination thereof.

However, because the height difference between the grooves 14 and the light-emitting units 12 is large, the conductive connecting structures 19 electrically connecting the light-emitting diode units 12 is easy to cause the connecting failure and to influence the yield of the device.

Besides, the aforementioned light emitting diode device 1 can further constitute and connect with other devices to form a light-emitting apparatus 100. FIG. 11 illustrates a conventional light-emitting apparatus 100. As shown in FIG. 11, a light-emitting apparatus 100 comprises one submount 110 comprising one circuit 101 thereon; the aforementioned light-emitting diode device 1 attached on the submount 110; and an electrical connecting structure 104 electrically connecting the first electrode pad 16' and the second electrode pad 18' of the first light-emitting diode device 1 and the circuit 101 on the lead frame 110. Wherein, the aforementioned submount 110 can be a lead frame or a large-sized mounting substrate which is advantageous for circuit design of the light-emitting apparatus and heat dissipating. The aforementioned electrical connecting structure 104 can be the bonding wire or other connecting structures.

SUMMARY OF THE DISCLOSURE

In accordance with the description above, the present disclosure provides a two dimensional array light-emitting diode device, especially relates to a two dimensional array HV light-emitting diode device with a high light extraction efficiency.

In an embodiment of the present application, a two dimensional array light-emitting diode device is disclosed, which includes a transparent substrate including a first surface; a plurality of adjacent light-emitting diode units arranged on the first surface, wherein each of the light-emitting diode units including a plurality of sides and a circumference; and a plurality of conductive connecting structures arranged on the first surface, electrically connecting the plurality of light-emitting diode units mentioned above; wherein the sides of each of the light-emitting diode units have a plurality of vertical distances between the closest light-emitting diode units, and when the plurality of vertical distances larger than 50 μm, the sides are not near the closest light-emitting diode units; wherein the ratio of the total length of the sides not near the light-emitting diode units of each light-emitting diode unit and the circumference of the light-emitting diode unit is larger than 50%.

In another embodiment of the present application, a two dimensional array light-emitting diode device is disclosed, which includes a transparent substrate including a first surface; a plurality of light-emitting diode units, wherein each of the light-emitting diode units including a first conductive type semiconductor layer, arranged on the first surface of the transparent substrate; a second conductive type semiconductor layer, arranged on the first conductive type semiconductor layer; and a light-emitting layer, arranged between the first type semiconductor layer and the second type semiconductor layer; and a plurality of conductive connecting structures, electrically connecting the plurality of light-emitting diode units, arranged on the first surface; wherein the distances between the light-emitting layers of each of the light-emitting diode unit and its adjacent light-emitting diode units are larger than 35 μm.

DETAILED DESCRIPTION OF PREFERRED EMBODIMENTS

Figure 1A:
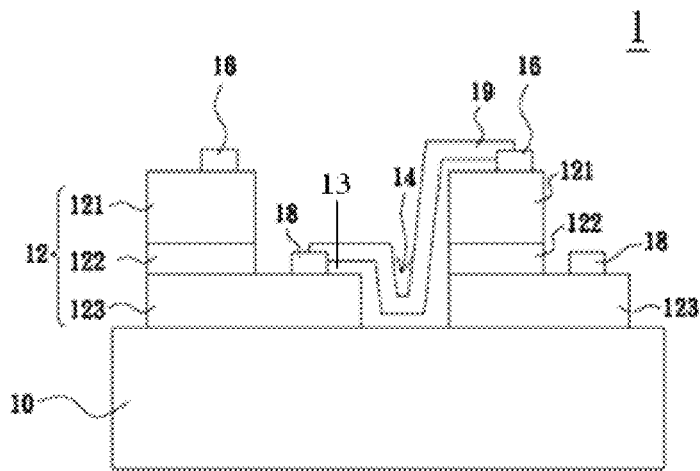
FIG. 1A illustrates a side-view structure of a conventional two dimensional array light-emitting diode device.
Figure 1B:
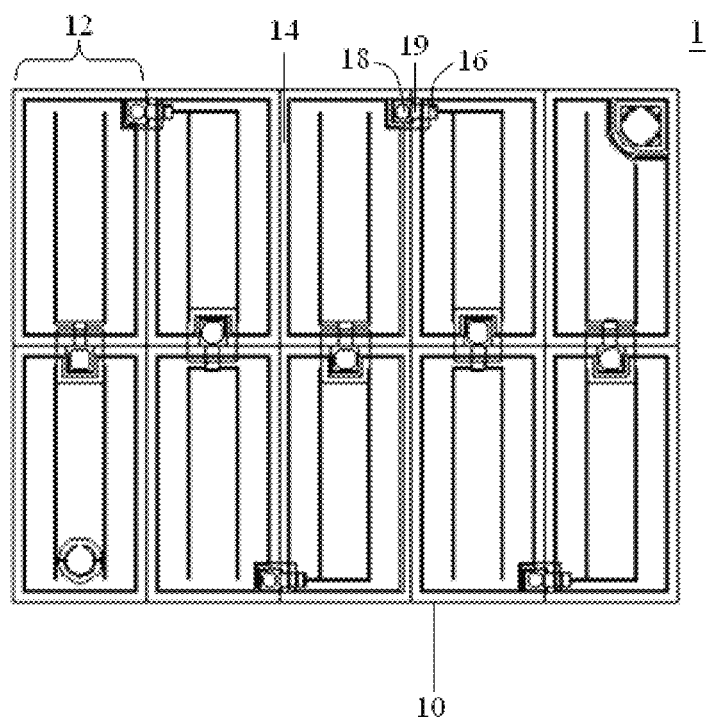
FIG. 1B illustrates a top-view structure of a conventional two dimensional array light-emitting diode device.
Figure 2A:
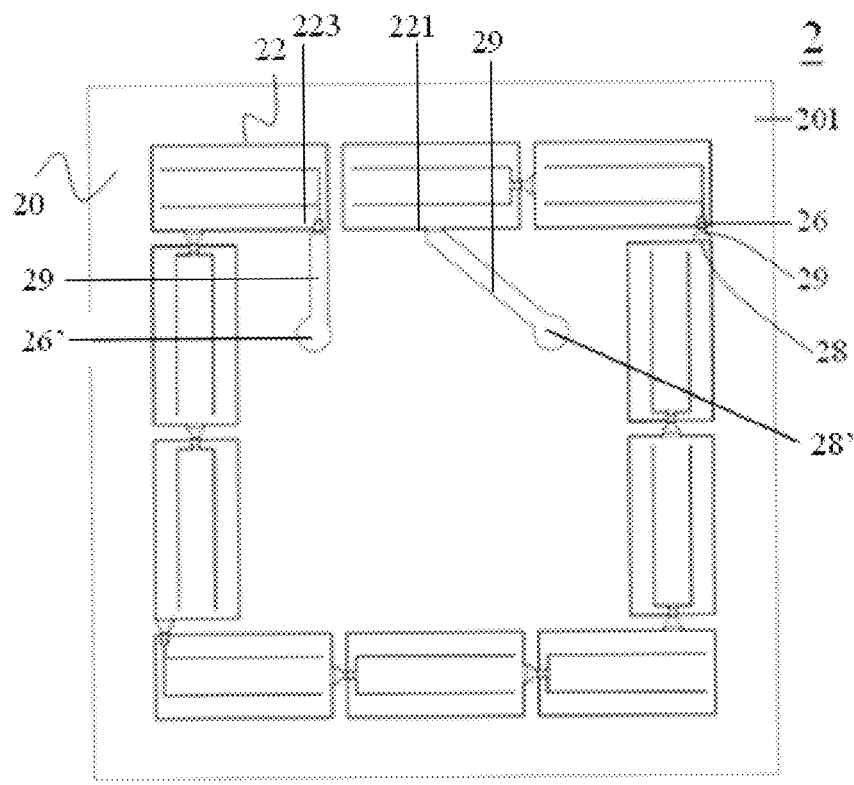
FIG. 2A illustrates a top-view structure of a two dimensional array light-emitting diode device in accordance with an embodiment of the present application.
Figure 2B:
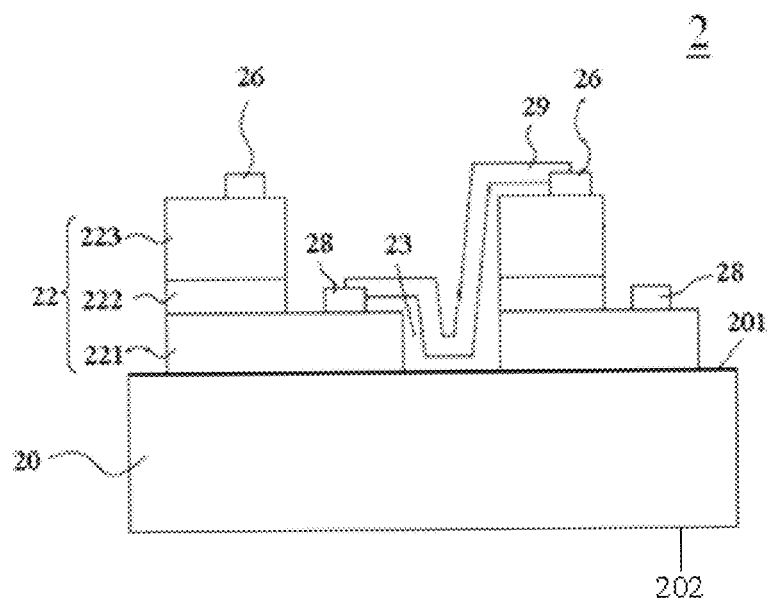
FIG. 2B illustrates a side-view structure of a two dimensional array light-emitting diode device in accordance with an embodiment of the present application.

The following discloses the embodiments of the present application in detail accompanying with the drawings. First, FIGS. 2A and 2B illustrate the top-view diagram and the side-view diagram of a two dimensional array light-emitting diode device 2 in accordance with the first embodiment of the present application, respectively. The two dimensional array light-emitting diode device 2 includes a transparent substrate 20 including a first surface 201 and a bottom surface 202 opposite to the first surface 201. The transparent substrate 20 is not limited to be composed of a single material and can also be composed of a plurality of different materials. For example, the transparent substrate 20 can be composed of two substrates including a first transparent substrate and a second transparent substrate connecting to each other (not shown). In the present embodiment, the material of the transparent substrate 20 is sapphire. In other embodiments, the material of the transparent substrate 20 can also comprise inorganic material such as lithium aluminum oxide ($LiAlO_2$), zinc oxide (ZnO), gallium phosphide (GaP), aluminum nitride (AlN), and glass or organic polymer material. Then, an array including a plurality of light-emitting diode units 22 extending two dimensionally on the first surface 201 of the transparent substrate 20 is formed. In the present embodiment, the manufacturing method discloses as the following:

First, the n-type semiconductor layer 221, the light-emitting layer 222, the p-type semiconductor layer 223 are sequentially formed on a growth substrate (not shown) by the traditional epitaxial growth method. In the present embodiment, the material of the growth substrate is gallium arsenide (GaAs). In other embodiments, the material of the growth substrate can also comprise germanium (Ge), indium phosphide (InP), sapphire, silicon carbide (SiC), silicon (Si), lithium aluminum oxide ($LiAlO_2$), zinc oxide (ZnO), gallium nitride (GaN), and aluminum nitride (AlN).

Then, a part of epitaxial layers is selectively removed by the photolithography method, and the remained epitaxial layers form a plurality of separated light-emitting diode units 22 on the growth substrate as shown in FIG. 2B. The light-emitting diode units can further include the exposed region of the n-type semiconductor by photolithography method, and the region can be used as the platform for the electrode to form thereon.

In order to increase the light extraction efficiency of the whole device, the epitaxial layer structures of the light-emitting diode units 22 can be arranged on the transparent substrate 20 by the substrate transferring method or the substrate bonding method. The light-emitting diode units 22 can be directly bonded to the transparent substrate 20 by heating, pressurizing, or bonding the light-emitting diode units 22 and the transparent substrate 20 with a transparent adhesive layer (not shown). The transparent adhesive layer can be an organic polymer transparent glue layer, such as polyimide, benzocyclobutene (BCB), perfluorocyclobutane (PFCB), Epoxy, Acrylic Resin, and polyethylene terephthalate (PET) or the combination thereof; a transparent conductive oxide metal layer, such as Indium Tin Oxide (ITO), Indium Oxide (InO), Tin Oxide (SnO), Fluoro Tin Oxide (FTO), Antimony Tin Oxide (ATO), Cadmium Tin Oxide (CTO), Aluminum Zinc Oxide (AZO), and Gallium Doped Zinc Oxide (GZO) or the combination thereof; or an inorganic layer, such as aluminum oxide ($Al_2O_3$), silicon dioxide ($SiO_2$), aluminum nitride (AlN), silicon nitride ($SiN_x$), titanium oxide ($TiO_2$), and the combination thereof.

In the present embodiment, the light-emitting diode units 22 are bonded to the transparent substrate 20 by using the benzocyclobutene (BCB) series material as the adhesive layer. In practice, the method of forming the light-emitting diode units 22 on the transparent substrate 20 is not limited to this embodiment; people with ordinary skill in the art can realize that depends on the different structure properties, the light-emitting diode units 22 can also be epitaxially formed on the transparent substrate. Besides, with different transfer frequency, for example, transfer twice, the structure with the p-type semiconductor layer adjacent to the substrate, the n-type semiconductor layer on the p-type semiconductor layer, and the light-emitting layer therebetween can also be formed.

Then, forming the insulating layer 23 on partial surfaces of the epitaxial layers of the light-emitting diode units 22 and the regions between the adjacent light-emitting diode units 22 by the chemical vapor deposition method (CVD), physical vapor deposition method (PVD), sputtering method, and so on in order to protect and electrically insulate the epitaxial layers of the adjacent light-emitting diode units 22. The material of the insulating layer 23 can be aluminum oxide ($Al_2O_3$), silicon dioxide ($SiO_2$), aluminum nitride (AlN), silicon nitride ($SiN_x$), titanium oxide ($TiO_2$), and the combination thereof.

Then, forming a first electrode 28 on the n-type semiconductor exposed region of the light-emitting diode unit 22, forming a second electrode 26 on the surface of the p-type semiconductor layer, and forming a conductive connecting structure 29 by the sputtering method in order to electrically connect the light-emitting diode units 22 therebetween on the first surface 201 of the transparent substrate. Take the embodiment for example, forming a first electrode 28 on the n-type semiconductor layer exposed region of the first light-emitting diode unit 22, forming a second electrode 26 on the p-type semiconductor layer 223 of the adjacent light-emitting diode unit 22, and forming a conductive connecting structure 29 between the two electrodes in order to electrically connect the two adjacent light-emitting diode units in series. The material of the conductive connecting structure 29 and the electrodes 26, 28 can be metal such as gold (Au), silver (Ag), copper (Cu), chromium (Cr), aluminum (Al), platinum (Pt), nickel (Ni), titanium (Ti), tin (Sn), the alloy or the stacks thereof. The materials of the first electrode 28, the second electrode 26, and the conductive connecting structure 29 can be the same or different, and the structures thereof can be made by one-step process or by multi-steps process.

In order to reduce the influence of the non-transparent metal structure for the light extraction efficiency on the light emitting diode device 2, as shown in FIG. 2A, based on different circuit designs, two conductive connecting structures 29 are respectively formed on the surfaces of the p-type semiconductor layer 223 of one light-emitting diode unit 22 and the n-type semiconductor layer 221 of another light-emitting diode unit 22 in the light-emitting diode units chain, and are extended to the first surface 201 of the substrate 20 uncovered by the epitaxial layer to form a first electrode pad 26' and a second electrode pad 28'. Through the two electrode pads, the device can electrically connect to external power by wiring or soldering. The process of forming the electrode pads 26' and 28' can proceed in the same process with forming the electrodes 26 and 28 or in multiple processes. The materials of forming the electrode pads 26' and 28' can also be the same with or different from the materials of the electrodes 26 and 28 or the conductive connecting structure 29.

Figure 3:
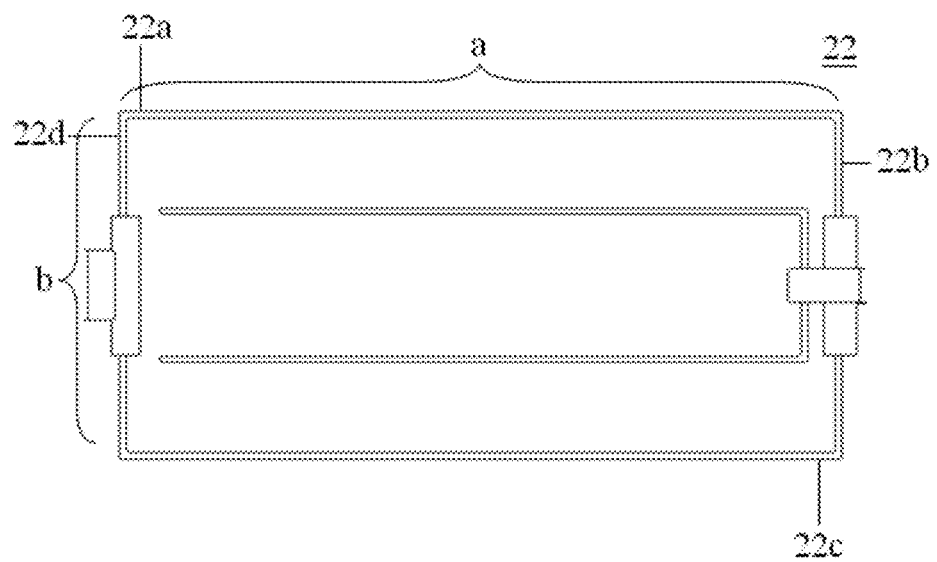
FIG. 3 illustrates a top-view structure of a light-emitting diode unit in accordance with an embodiment of the present application.

FIG. 3 illustrates the enlarged top view of the light-emitting diode unit 22. In the present embodiment, each light-emitting diode unit 22 is a rectangle having four sides 22a (length a), 22b (length b), 22c (length a), and 22d (length b), and the circumference of the light-emitting diode unit 22 are the total lengths of the four sides, that is, 2a+2b.

Figure 4A:
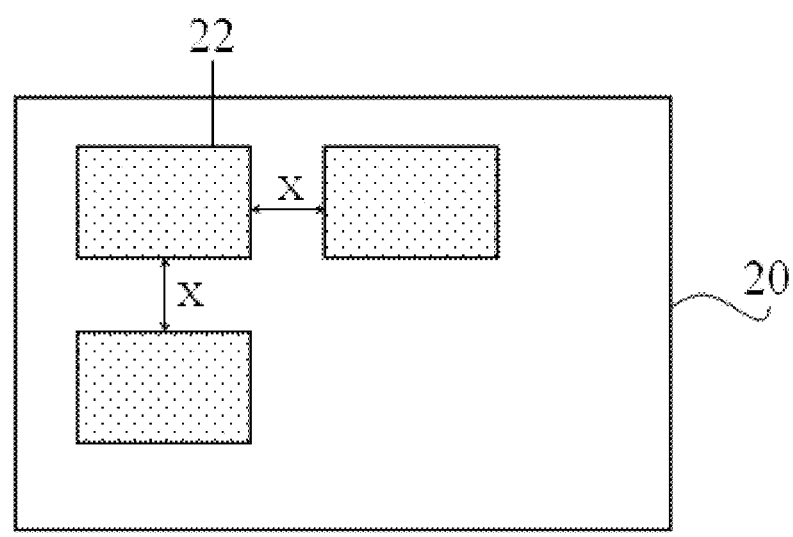
FIGS. 4A-4B illustrate the top-view diagrams of two dimensional array light-emitting diode devices in accordance with the embodiments of the present application.
Figure 4B:
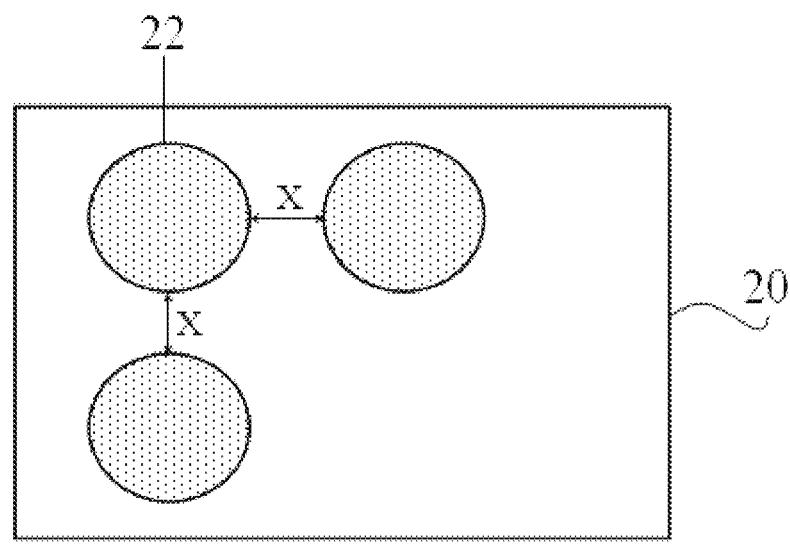

In the embodiment of the present application, the arrangement of the light-emitting diode units in the device is proposed to enhance the light extraction efficiency of the light emitting diode device. In the conventional two dimensional array light-emitting diode device, when two light-emitting diode units is too close, the light emitted from the light emitting diode unit is reabsorbed easily by the semiconductor layers which have similar band gap (especially the light-emitting layers) in the neighboring light-emitting diode units, and the total light extraction efficiency of the device can be influenced. In order to reduce the reabsorption, the distance between each light-emitting diode units 22 is enlarged. In the present embodiment, because the band gaps of the light-emitting layers are close, the light reabsorption is more obvious. Therefore, taking the distances between the light-emitting layers as the reference, all the distances between the light-emitting layers of the ten light-emitting diode units is preferred to be larger than 35 μm. Besides, the portion of the sides neighboring with another light-emitting diode unit 22 is preferably reduced. Referring to FIG. 4A, when the vertical distance x between the sides of neighboring light-emitting diode units 22 is larger than 50 μm, the chance of reabsorption between two adjacent light-emitting diode units is lower. In that case, the two sides of the light-emitting diodes with the distance larger than 50 μm are defined as not being near each other. This definition can be extensively applied to light-emitting diode units 22 with different shapes. As shown in FIG. 4B, the circular light-emitting diode units 22 can be arranged not near each other on the substrate in a two-dimensional array form in order to reduce the chance of reabsorption between each other and to enhance the light extraction efficiency of the light-emitting diode device.

Figure 5:
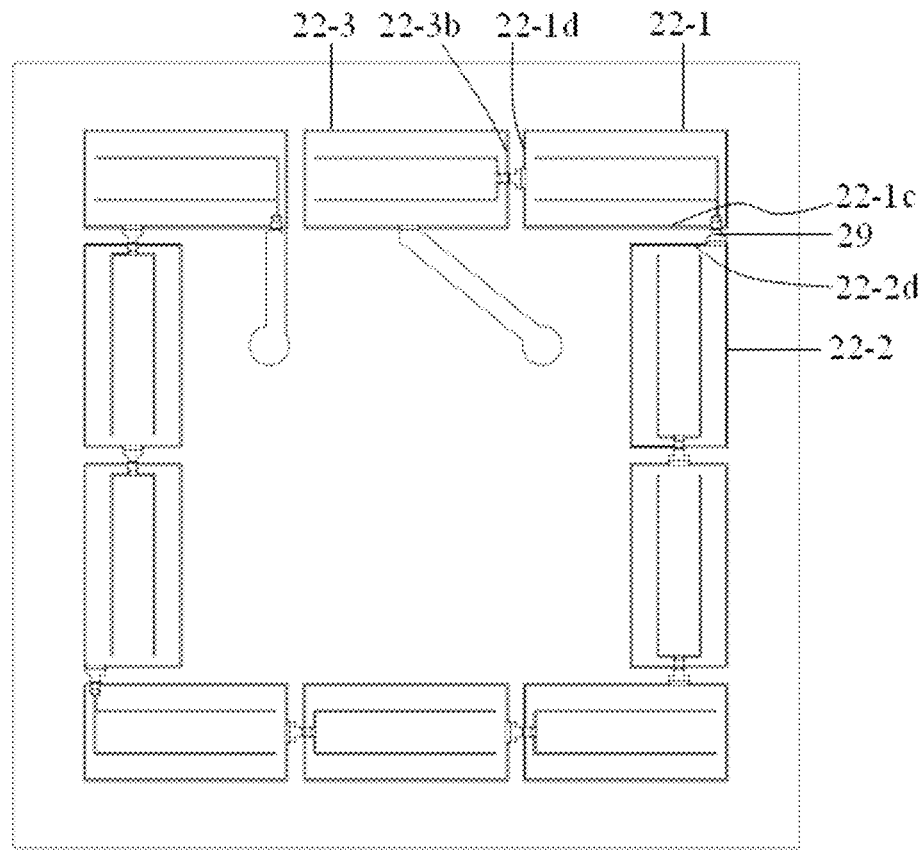
FIG. 5 illustrates a top-view diagram of a two dimensional array light-emitting diode device in accordance with another embodiment of the present application.

In the above embodiments, a "not-near value" α for a light-emitting diode unit 22 is defined as the ratio of the total length of the sides of one light-emitting diode unit 22 not near another light-emitting diode unit to the circumference of one light-emitting diode unit 22. As shown in FIG. 5, the ten light-emitting diode units 22 are numbered and the not-near value α of the light-emitting diode unit 22-1 is calculated. The sides of the light-emitting diode unit 22-1 and the light-emitting diode unit 22-2 thereunder are connected by the conductive connecting structure 29, and the vertical distance between the side 22-1c and the side 22-2d is smaller or equal to 50 μm, that is, the near-each-other length of the sides 22-1c and 22-2d is b. Similarly, the distance between the side 22-1d of the light-emitting diode unit 22-1 and the side 22-3b of the light-emitting diode unit 22-3 on the left hand side thereof is smaller than 50 μm. That is, they are also near each other, and the length is b. Besides, the circumference of the light-emitting diode unit 22-1 is 2a+2b. In this embodiment, the light-emitting diode unit comprises the sides with the length 2b near other light-emitting diode units, and the total not-near length of the sides is (2a+2b)−2b=2a. Therefore, the not-near value α is 2a/(2a+2b). The same calculation formula can be applied to the light-emitting diode units 22 with different shapes. In that case, the sides of one light-emitting diode unit are divided into a plurality of points, and the tangent line along the side of each point is given. The vertical distance along the tangent line between each point and the nearest side of other light-emitting diode units is then calculated. After determining the distance of each point with the nearest light-emitting diode unit, all the not-near sides are integrated, and the integral value is the total length of the not-near sides. The not-near value α is the ratio of the integral value to the circumference of the light-emitting diode unit.

Figure 6A:
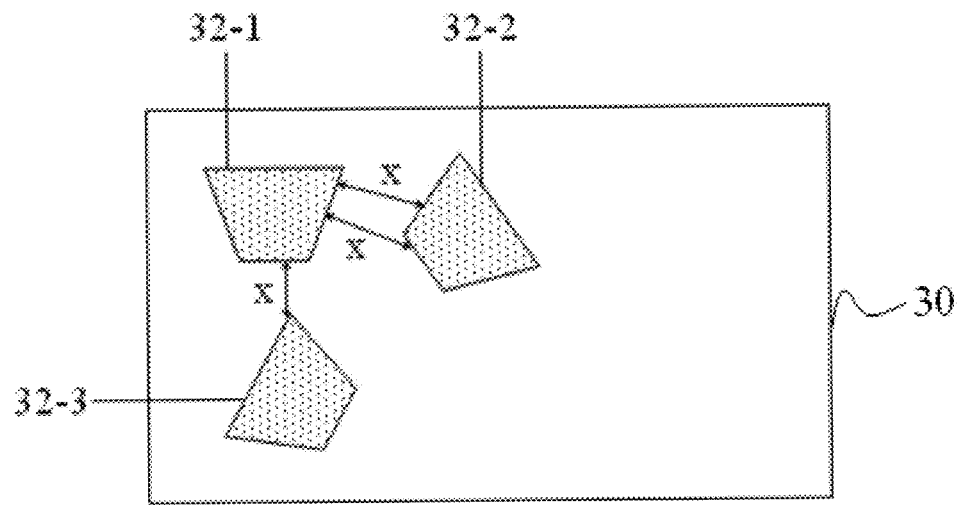
FIGS. 6A-6B illustrate the top-view diagrams of two dimensional array light-emitting diode devices in accordance with the embodiments of the present application.
Figure 6B:
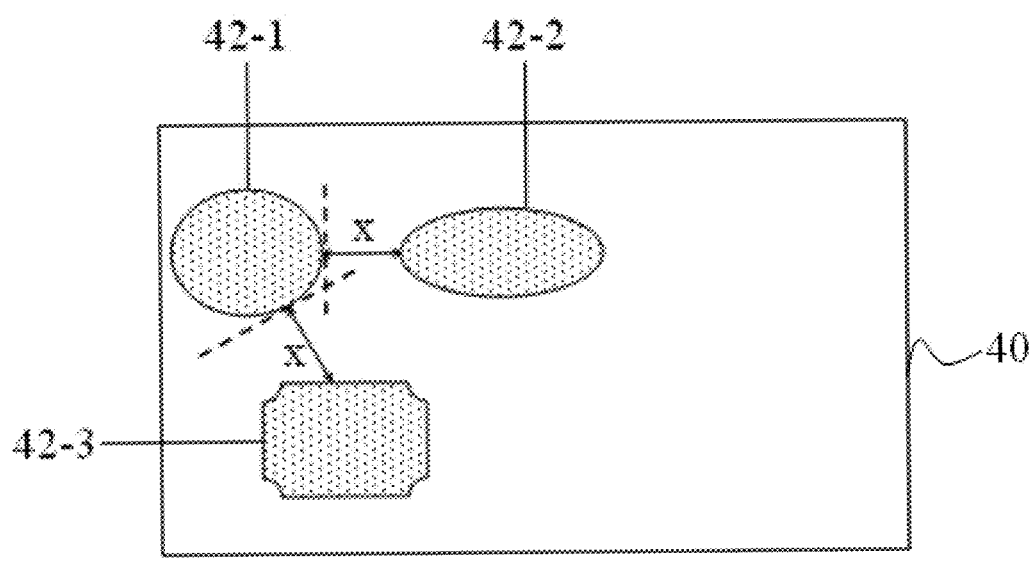
Figure 7:
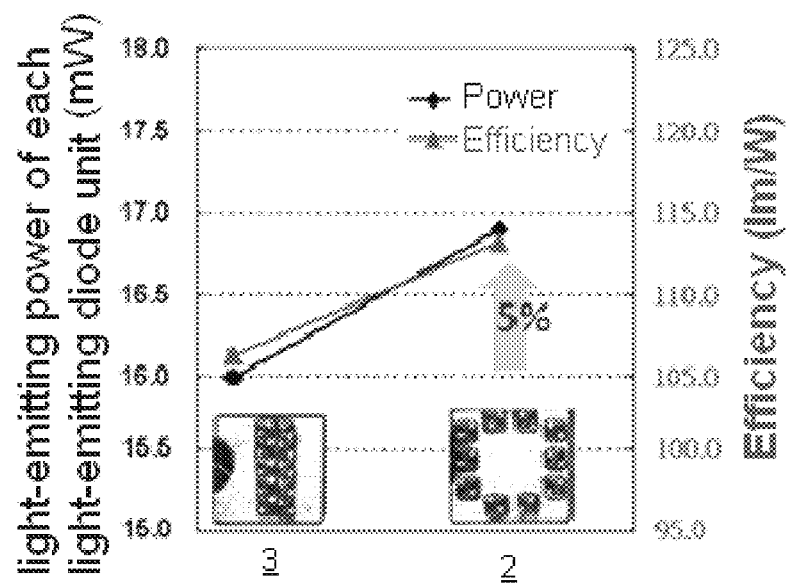
FIG. 7 illustrates a comparison chart of the light-emitting efficiency and the light-emitting power of each light-emitting diode unit in accordance with different two dimensional array light emitting diode devices.

Taking FIGS. 6A and 6B for example, whether each point of the light-emitting diode unit with irregular shape is near other light-emitting diode units or not can be further determined. If the shape of the light-emitting diode unit is irregular, the vertical distance x of each point is calculated by taking each point on the side of the light-emitting diode unit along the direction vertical to the side. When the side is a curve, a tangent line for each point on the curve is given and the vertical distance of the point along the direction vertical to the tangent line is calculated. In FIGS. 6A and 6B, light-emitting diode unit 32-1 and light-emitting diode unit 42-1 are referred to demonstrate the calculation formulas for the vertical distances between different positions of the sides of the light-emitting diode unit and the nearest light-emitting diode units 32-2, 32-3, 42-2, and 42-3.

In accordance with the experiment results, when the not-near value α of the light-emitting diode unit on the two dimensional array diode device is larger than 50%, the light emitting efficiency of the light-emitting diode device 2 is 5% better than that of the conventional closely arranged two dimensional array light-emitting diode device 3. As shown in the comparison chart of the light-emitting efficiency between different light-emitting diode devices and the light-emitting power of each light-emitting diode unit, when the side length a of each light-emitting diode unit in the light-emitting diode device 2 is 560 μm and the side length b of each light-emitting diode unit in the light-emitting diode device 2 is 290 μm, the not-near value α is about 65%. The light emitting efficiency of the light-emitting diode device 2 can be 10% better than the conventional closely arranged two dimensional array light-emitting diode device 3.

Figure 8A:
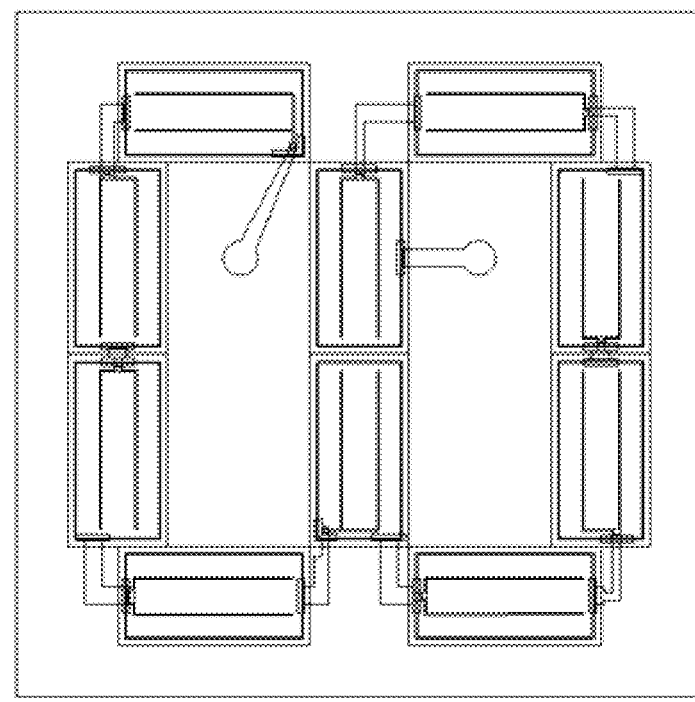
FIGS. 8A-8C illustrate the top-view diagrams of two dimensional array light-emitting diode devices in accordance with the embodiments of the present application.
Figure 8B:
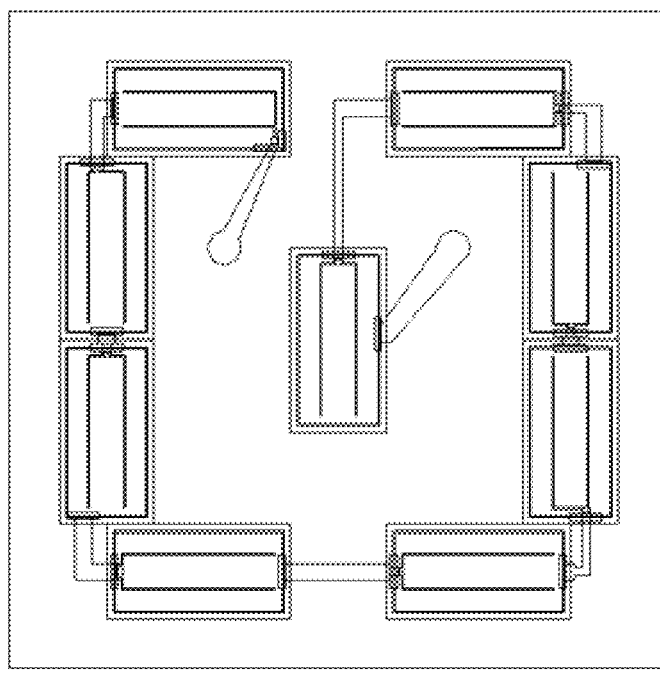
Figure 8C:
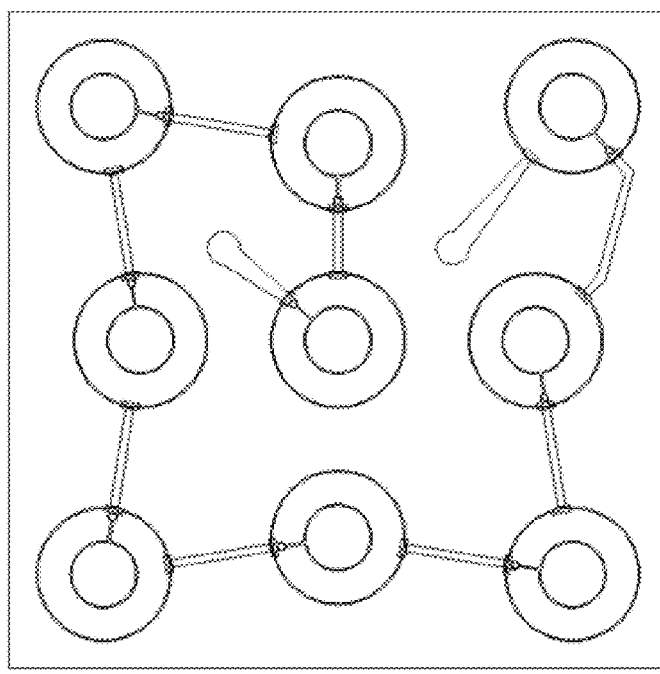
Figure 9A:
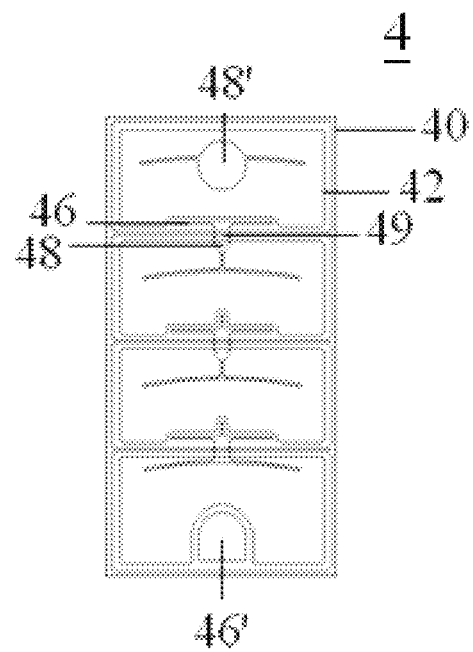
FIGS. 9A-9D illustrate the top-view diagrams of the single string serially-connected light-emitting diode devices in accordance with the embodiments of the present application.
Figure 9B:
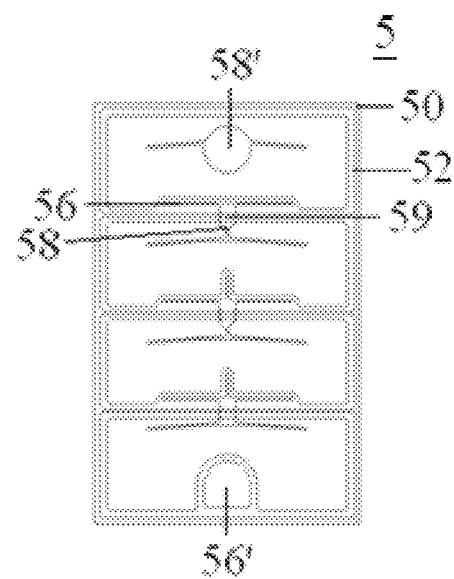
Figure 9C:
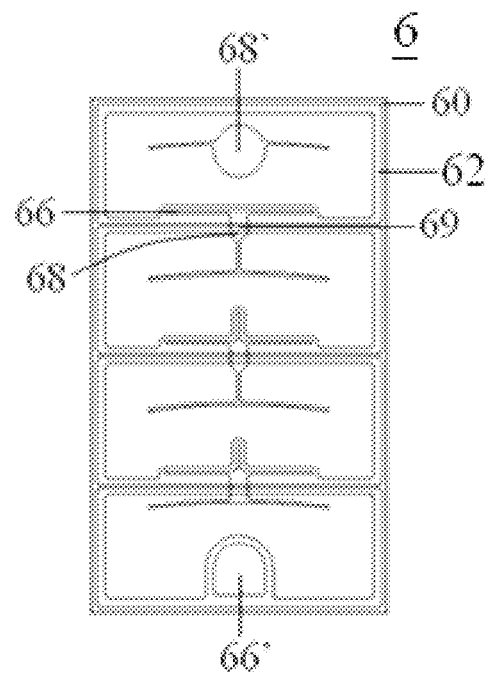
Figure 9D:
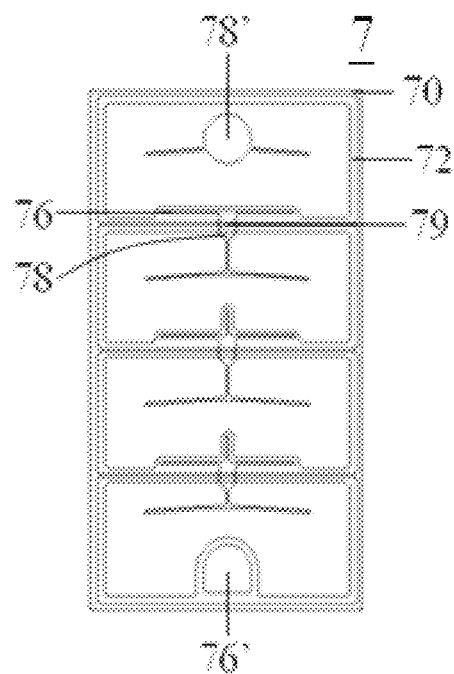

FIGS. 8A to 8C show other embodiments of the two dimensional array light-emitting diode devices to fit the arrangements of the light-emitting diode units with not-near value α larger than 50%.

Besides, in order to enhance the total light emitting efficiency of the device, the first surface and/or the backside surface can be roughened by wet etching method or dry etching method so the light scattering probability and the light extraction probability are increased. Furthermore, viewing from the top, when the light emitting diode unit 22 is disposed on the transparent substrate 20, the shortest distance between the position of the light emitting layer of the light emitting diode unit 22 vertically projected on the first surface and any side faces is preferably larger than 20 μm in order to enhance the probability of the light extracted from the transparent substrate 20.

Under the similar concept, the single string of serially-connected high voltage light-emitting diode devices on the transparent substrate can be adequately arranged in a two dimensional form to increase the not-near value α of each light emitting diode unit in each serially-connected light-emitting diode device.

FIGS. 9A to 9D illustrate different single string of serially-connected high voltage light-emitting diode devices 4, 5, 6, 7, respectively. Each serially-connected high voltage light-emitting diode device comprises four light emitting diode units 42, 52, 62, 72 formed on the substrate 40, 50, 60, 70 by epitaxy or by bonding, respectively. Similar with the structures mentioned above, forming the first electrodes 46, 56, 66, 76 on exposed regions of the n-type semiconductor of the first light emitting diode units 42, 52, 62, 72, respectively, extending the conductive connecting structures 49, 59, 69, 79 to another adjacent light emitting diode units 42, 52, 62, 72, and forming the second electrodes 48, 58, 68, 78 on the p-type semiconductor layer of the adjacent light emitting diode unit 42 in order to electrically connect two adjacent light emitting diode units 42, 52, 62, 72 in series. In each single string of serially-connected high voltage light-emitting diode devices 4, 5, 6, 7, two light emitting diode units 42, 52, 62, 72 at the two ends in each string further comprise the first electrode pads 46', 56', 66', 76', and the second electrode pads 48', 58', 68', 78', respectively, which are used to electrically connect to the external device or the power source.

Figure 10:
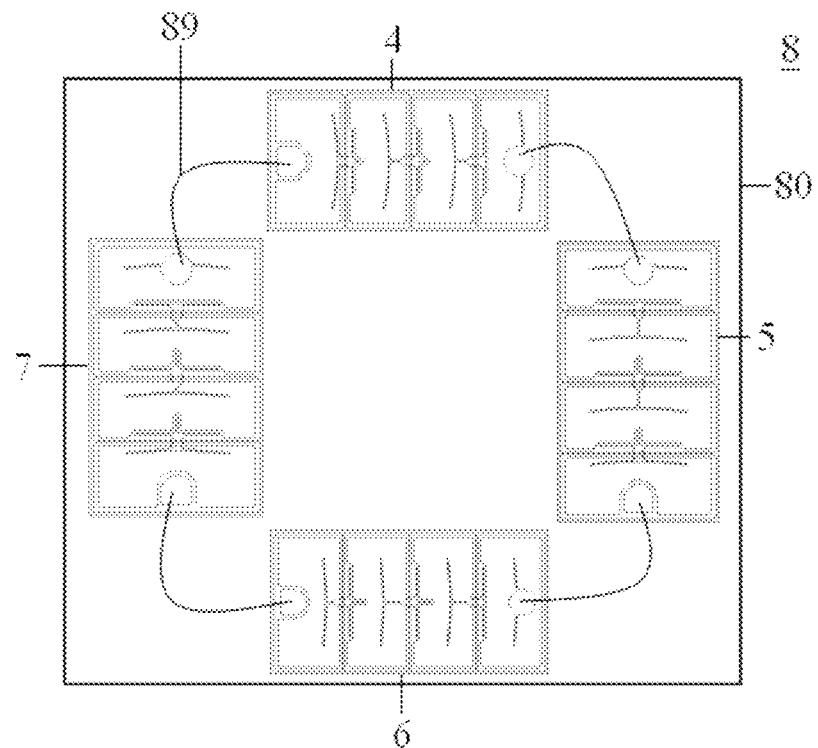
FIG. 10 illustrates a top-view diagram of a two dimensional array light-emitting diode device in accordance with another embodiment of the present application.
Figure 11:
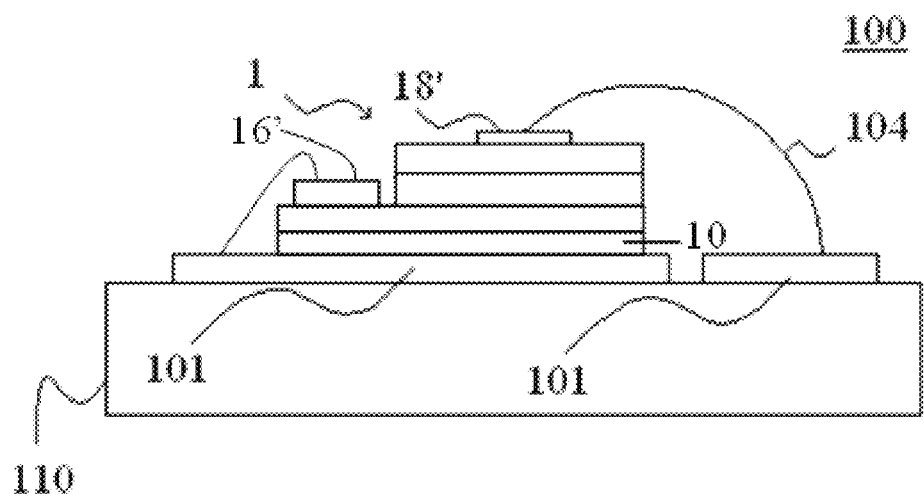
FIG. 11 illustrates the top-view diagram of a conventional light-emitting apparatus.

More than one of the single string of the serially-connected high voltage light-emitting diode devices 4, 5, 6, 7 can be attached to a single transparent substrate 80 to a transparent adhesive layer, and the light-emitting diode devices 4, 5, 6, 7 can be electrically connected to each other by the wire-bonding process or forming conductive connecting structures 89 through the photolithography process. With adequate arrangement, it is possible to form a two dimensional array of light-emitting diode device with a not-near value α higher than that of the conventional compact two dimensional array of light-emitting diode device in order to achieve the higher light extraction efficiency as shown in FIG. 10.

The embodiments mentioned above are used to describe the technical thinking and the characteristic of the invention and to make the person with ordinary skill in the art to realize the content of the invention and to practice, which could not be used to limit the claim scope of the present application. Any modification or variation according to the spirit of the present application should also be covered in the claim scope of the present disclosure.

What is claimed is:

1. A two dimensional array light-emitting diode device, comprising:
   a transparent substrate comprising a first surface;
   a plurality of light-emitting diode units arranged on the first surface, wherein each of the light-emitting diode units comprises a plurality of sides and a circumference; and
   a plurality of conductive connecting structures arranged on the first surface, electrically connecting the plurality of light-emitting diode units;
   wherein the sides of each of the light-emitting diode units comprises a plurality of vertical distances between the closest light-emitting diode units, and when the plurality of vertical distances larger is than 50 μm, the sides are not near the closest light-emitting diode units;
   wherein the ratio of the total length of the sides not near the closest light-emitting diode units of each light-emitting diode unit and the circumference of the light-emitting diode unit is larger than 50%.

2. The two dimensional array light-emitting diode device of claim 1, wherein the light-emitting diode units are formed on the first surface of the transparent substrate by epitaxial method or arranged on the first surface of the transparent substrate by a transparent adhesive layer.

3. The two dimensional array light-emitting diode device of claim 2, wherein the transparent adhesive layer is an organic polymer transparent glue layer, a transparent conductive metal oxide layer, or an inorganic insulating layer.

4. The two dimensional array light-emitting diode device of claim 3, wherein the material of the transparent adhesive layer is selected from the group consisting of polyimide, benzocyclobutene (BCB), perfluorocyclobutane (PFCB), Epoxy, Acrylic Resin, and polyethylene terephthalate (PET) or the combination thereof.

5. The two dimensional array light-emitting diode device of claim 3, wherein the material of the transparent adhesive layer is selected from the group consisting of Indium Tin Oxide (ITO), Indium Oxide (InO), Tin Oxide (SnO), Fluoro Tin Oxide (FTO), Antimony Tin Oxide (ATO), Cadmium Tin Oxide (CTO), Aluminum Zinc Oxide (AZO), and Gallium Doped Zinc Oxide (GZO) or the combination thereof.

6. The two dimensional array light-emitting diode device of claim 3, wherein the material of the transparent adhesive layer is selected from the group consisting of aluminum oxide ($Al_2O_3$), silicon dioxide ($SiO_2$), aluminum nitride (AlN), silicon nitride ($SiN_x$), titanium oxide ($TiO_2$), and the combination thereof.

7. The two dimensional array light-emitting diode device of claim 1, wherein each of the light-emitting diode units further comprises:
   a first conductive type semiconductor layer, arranged on the first surface of the transparent substrate;
   a second conductive type semiconductor layer, arranged on the first conductive type semiconductor layer; and
   a light-emitting layer, arranged between the first type semiconductor layer and the second type semiconductor layer.

8. The two dimensional array light-emitting diode device of claim 7, wherein each of the conductive connecting structures is arranged between two adjacent light-emitting diode units and electrically connect the first conductive type semiconductor layer of one of the two adjacent light-emitting diode units and the second conductive type semiconductor layer of the other of the two adjacent light-emitting diode units.

9. The two dimensional array light-emitting diode device of claim 7, wherein the distances between the light-emitting layers of each of the light-emitting diode unit and its adjacent light-emitting diode units are not smaller than 35 μm.

10. The two dimensional array light-emitting diode device of claim 7, wherein the transparent substrate comprises a substrate side, when view from the top of the first surface of the transparent substrate, the distances between the positions the light-emitting layers of the light-emitting diode units projecting to the first surface of the transparent substrate and the substrate side are not smaller than 20 μm.

\* \* \* \* \*